US012676609B2

(12) United States Patent
Pidutti et al.

(10) Patent No.: US 12,676,609 B2
(45) Date of Patent: Jul. 7, 2026

(54) DEGRADATIONS DETECTION FOR MOS-TRANSISTORS AND GATE-DRIVERS

(71) Applicants: Universita degli Studi di Milano-Bicocca, Milan (IT); Infineon Technologies AG, Neubiberg (DE)

(72) Inventors: Albino Pidutti, Martignacco (IT); Jens Barrenscheen, Munich (DE); Andrea Baschirotto, Tortona (IT); Paolo Del Croce, Villach (AT); Ordwin Haase, Neubiberg (DE); Andre Mourrier, Manosque (FR)

(73) Assignees: Infineon Technologies AG, Neubiberg (DE); Universita degli Studi di Milano-Bicocca, Milan (IT)

( * ) Notice: Subject to any disclaimer, the term of this patent is extended or adjusted under 35 U.S.C. 154(b) by 10 days.

(21) Appl. No.: 18/604,951

(22) Filed: Mar. 14, 2024

(65) Prior Publication Data

US 2024/0313764 A1 Sep. 19, 2024

(30) Foreign Application Priority Data

Mar. 15, 2023 (DE) ............................ 102023106481

(51) Int. Cl.
*H03K 17/14* (2006.01)
*G01R 31/26* (2020.01)
*H03K 17/687* (2006.01)

(52) U.S. Cl.
CPC ....... *H03K 17/145* (2013.01); *G01R 31/2621* (2013.01); *H03K 17/6871* (2013.01)

(58) Field of Classification Search
CPC .. H03K 17/145; H03K 17/6871; H03K 5/125; H03K 5/24; G01R 31/2621; G01R 1/28; G01R 31/2601; G01R 31/2608; G01R 31/282; G01R 31/2836; G01R 31/2843
See application file for complete search history.

(56) References Cited

U.S. PATENT DOCUMENTS

| | | | |
|---|---|---|---|
| 2012/0293219 A1 | 11/2012 | Bai et al. | |
| 2020/0139139 A1* | 5/2020 | Crawford | G16H 40/40 |
| 2022/0407406 A1* | 12/2022 | Pidutti | H03K 17/04206 |

FOREIGN PATENT DOCUMENTS

| | | | | |
|---|---|---|---|---|
| DE | 102017100972 A1 | 7/2018 | | |
| DE | 102021116029 A1 | 12/2022 | | |
| EP | 2034322 A1 * | 3/2009 | | H03K 5/156 |

* cited by examiner

*Primary Examiner* — Metasebia T Retebo
(74) *Attorney, Agent, or Firm* — Slater Matsil, LLP

(57) ABSTRACT

In accordance with an embodiment, a method includes: generating a gate voltage for a field-effect transistor in response to an input signal; generating a pulse signal with a pulse length that corresponds to the time that it takes until the gate voltage attains a specific level transition in response to a corresponding level transition in the input signal; and monitoring the pulse signal to detect whether the pulse length is outside a specific range.

20 Claims, 5 Drawing Sheets

(a)             (b)

DEGRADATIONS DETECTION FOR MOS-TRANSISTORS AND GATE-DRIVERS

This application claims the benefit of German Patent Application No. 102023106481.9, filed on Mar. 15, 2023, which application is hereby incorporated herein by reference.

TECHNICAL FIELD

This disclosure relates to the field of gate driver circuits for MOS transistors. Embodiments described herein particularly relate to driver circuits that detects a degradation of the MOS transistor or the driver circuit.

BACKGROUND

A large variety of gate driver circuits for Metal-Oxide-Semiconductor (MOS) transistors is known. Generally, gate driver circuits (gate drivers) can be optimized with regard to a specific desired switching behavior. In some applications a short switching time (i.e. a fast switching) is an important design goal for gate drivers.

In switching power supply applications such as, for example, in DC/DC switching converters a higher switching frequency allows to reduce the size of the reactive circuit components (capacitors and inductors), which may be desirable for various reasons (size, costs, etc). A high switching frequency requires a correspondingly high-speed switching of the power transistors used in the switching converters, wherein the gate driver is crucial for the achievable switching speed.

In many applications, it is desirable or necessary to detect a degradation or impairment of power circuits (including one or more MOS transistors and the respective gate drivers) early, because the integrity of the MOS transistors and their gate drivers are essential for the proper functioning of the overall system (e.g. a switching converter). An early detection of any degradation of the power circuit allows to timely intervene in order to avoid greater damage, which might become even risky for the users. This disclosure deals with improved driver circuits that allow a degradation detection in a power circuit including a MOS transistor and a respective gate driver.

SUMMARY

A circuit is described herein, which may be used to detect degradation of a power circuit. In accordance with one embodiment, the circuit includes: a control circuit configured to generate a gate voltage for a field-effect transistor in response to an input signal; a pulse generator configured to generate a pulse signal, wherein the pulse signal has a pulse length that corresponds to the time that it takes until the gate voltage performs a specific level transition in response to a corresponding level transition in the input signal; and a comparator circuit configured to receive the pulse signal and to detect whether the pulse length is above a first threshold or below a second threshold.

Moreover a method is described, which may be used to detect degradation of a power circuit. In accordance with one embodiment, the method includes: generating a gate voltage for a field-effect transistor in response to an input signal; generating a pulse signal with a pulse length that corresponds to the time that it takes until the gate voltage performs a specific level transition in response to a corresponding level transition in the input signal; and monitoring the pulse signal to detect whether the pulse length is above a first threshold or below a second threshold.

BRIEF DESCRIPTION OF THE DRAWINGS

In the following detailed description, reference is made to the accompanying drawings. The drawings form a part of the description and, for the purpose of illustration, show examples of how the invention may be used and implemented. It is to be understood that the features of the various embodiments described herein may be combined with each other, unless specifically noted otherwise.

DETAILED DESCRIPTION OF THE EMBODIMENTS

Figure 1:
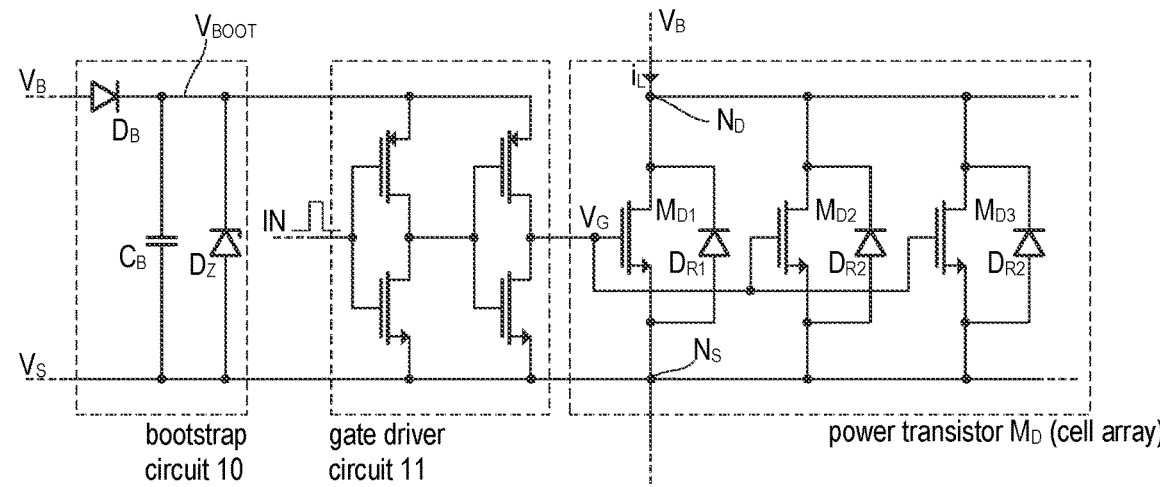
FIG. 1 illustrates one common implementation of a gate driver circuit for driving a high-side transistor.

FIG. 1 illustrates one common implementation of a gate driver circuit for driving a high-side transistor. In the present example, the high-side transistor is an n-channel power transistor (e.g. a field-effect transistor such as DMOS transistor) denoted as $M_D$. The diode $D_R$ coupled in parallel to the transistors drain-source current path represents the transistor's intrinsic body diode, which is always present in most semiconductor fabrication technologies. In the depicted example, the high-side transistor $M_D$ is composed of a plurality of individual transistor elements $M_{D1}$, $M_{D2}$, $M_{D3}$, etc. that are coupled in parallel and arranged in a so-called transistor cell array.

The gate driver circuit 11 includes a series of CMOS inverter circuits, wherein the input signal IN, applied to the input of the driver circuit is a logic signal, which is basically forwarded to the power transistor's gate electrode. When the power transistor $M_D$ is switched on, the source voltage $V_S$ (at circuit node $N_S$) will be close to the drain voltage $V_B$ of the transistor $M_D$ and, therefore, the supply voltage $V_{BOOT}$ for the gate driver 11 needs to be shifted to a voltage level higher than the drain voltage $V_B$ applied to the power transistor $M_D$. This is usually accomplished by a so-called bootstrap circuit.

In the present example the bootstrap circuit 10 includes a series circuit composed of rectifier diode $D_B$ and capacitor $C_B$, wherein the series circuit is coupled between a circuit node providing the supply voltage $V_B$ and circuit node $N_S$. The capacitor $C_B$ is charged while the transistor $M_D$ is off and the circuit node $N_S$ is pulled down (e.g., by a load coupled between the node $N_S$ and ground) to lower voltage levels, e.g. ground potential or close to ground. The capacitor $C_B$ is charged up to a voltage $V_{BOOT}$ which is limited by the Zener voltage of Zener diode $D_Z$ coupled in parallel to the capacitor $C_B$. When the transistor $M_D$ is switched on, the circuit node $N_S$ is pulled close to the supply voltage $V_B$ and the rectifier diode $D_B$ becomes reverse biased (and blocking) which the capacitor $C_B$ still can provide the supply voltage $V_{BOOT}$ to the gate driver 11. Various implementations of bootstrap circuits are known and are thus not further discussed herein.

A degradation of the power transistor may result in a situation, in which some of the transistor elements (transistor cells) are not functional and cannot be activated by applying a gate voltage. This may be, for example the case, when the wiring of the gate electrodes of some transistor cells have become defect. In this case the overall gate capacitance is reduced as compared to a flawless power transistor.

Figure 2:
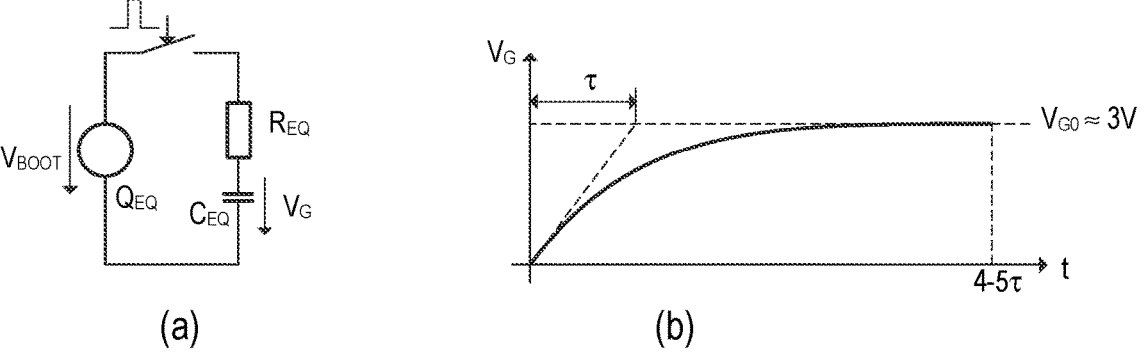
FIG. 2 illustrates an equivalent circuit of the driver circuit (diagram (a)) and a timing diagram (diagram (b)) illustrating the charging process of the transistor gate.

FIG. 2, diagram (a), illustrates an equivalent circuit of the gate driver circuit and the transistor gate connected thereto. The transistor gate is represented by the capacitance $C_{EQ}$, which is basically determined by the gate capacitance of the power transistor $M_D$. The resistor $R_{EQ}$ coupled in series to the capacitor $C_{EQ}$ represents the effective output resistance of the gate driver circuit 11, and the voltage source represents the voltage $V_{BOOT}$ provided by the capacitor $C_B$ shown in FIG. 1. For the further discussion we assume that capacitor $C_{EQ}$ is initially discharged (i.e. transistor $M_D$ is off). When the switch SW is closed, the voltage $V_{BOOT}$ is applied to the series circuit of resistor $R_{EQ}$ and capacitor $C_{EQ}$ causing the capacitor $C_{EQ}$ to be charged (i.e. switching transistor $M_D$ on). FIG. 2, diagram (b), illustrates a timing diagram of the voltage $V_G$ across the capacitor $C_{EQ}$, which corresponds to the gate-source voltage in the circuit of FIG. 1. The equivalent circuit of FIG. 2, diagram (a), is a first-order low pass having a time constant of $\tau = R_{QE}C_{EQ}$. It takes usually a time of $4\tau$ to $5\tau$ to charge the gate capacitance $C_{EQ}$ to a level $V_{G0}$ (approximately 3 V in the current example) that is sufficiently high to drive the transistor into its low-ohmic state (on-resistance $R_{ON}$ of transistor $M_D$). The level $V_{G0}$ basically corresponds to the bootstrap voltage $V_{BOOT}$. In the following, a concept is described which allows to shorten the charging time in order to increase the switching speed.

Figure 3:
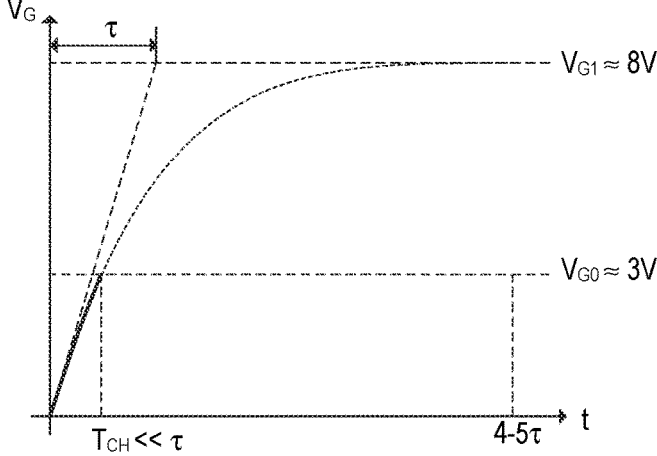
FIG. 3 illustrates, in a schematic timing diagram, the charging process of a transistor gate when using a driver circuit according to the embodiments described herein.

The timing diagram of FIG. 3 illustrates how the charging curve of FIG. 2, diagram (b), changes if the bootstrap voltage $V_{BOOT}$ is increased from $V_{G0}$ to $V_{G1}$, which is approximately 8 V in the present example. Due to the higher bootstrap voltage $V_{BOOT}$, the gate voltage $V_G$ reaches the target level of $V_{G0}$ in significantly less time. In the depicted example, the voltage level $V_{G0}$ is reached in a charging time of $T_{CH}$ which can be significantly lower than the time constant $\tau$. The problem with increasing the bootstrap voltage to, e.g., 8 V is that the charging process must be reliably interrupted as soon as the target level of 3 V is reached. Otherwise the gate oxide of the power transistor may be destroyed.

Figure 4:
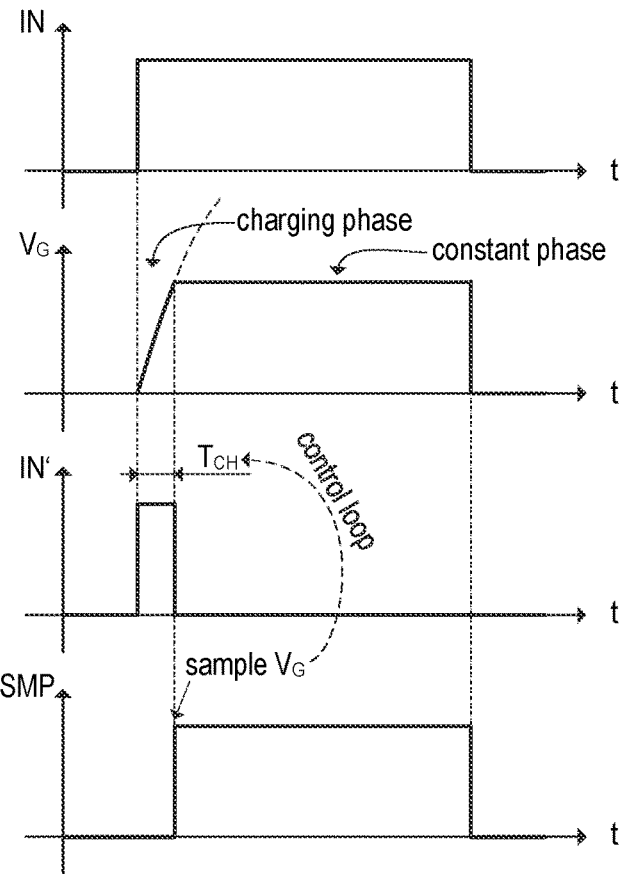
FIG. 4 illustrates timing diagrams illustrating, by way of example, the operation principle of the circuits of FIGS. 5 and 6.

The embodiments described below use an approach to reliably limit the gate voltage $V_G$ to the desired target voltage $V_{G0}$ while using significantly higher bootstrap voltages (e.g. 8 V or higher). The concept is first explained using the timing diagrams of FIG. 4. The first diagram (top) of FIG. 4 illustrates the control signal IN, which can be regarded as the input signal of the gate driver circuit. The signal IN is a logic signal indicating (e.g. by a high signal level for a time interval $T_{ON}$) the desired switching state of the power transistor $M_D$. The rising edge of the signal IN triggers the process of charging the gate capacitance $C_{EQ}$ of the power transistor $M_D$. Conversely, the falling edge of the signal IN triggers the process of discharging the gate capacitance $C_{EQ}$.

However, the gate capacitance is not charged for the whole time interval $T_{ON}$ but only for a short time interval $T_{CH}$, which is indicated by a high level of signal IN' (see third diagram (from the top) of FIG. 4). The time intervals $T_{ON}$ and $T_{CH}$ begin at the same time instant, wherein $T_{CH}$ is only a fraction of $T_{ON}$. As can be seen in the second diagram of FIG. 4, the gate voltage $V_G$ rises during the time interval $T_{CH}$ (as the charge stored in the gate capacitor increases), whereas the gate voltage $V_G$ remains basically constant (or slowly decreases) after the time interval $T_{CH}$ during the remaining part of the time interval $T_{ON}$. At the end of the time interval $T_{ON}$ (on-time) the gate capacitor is discharged, for example by connecting the gate electrode to the source electrode of the power transistor by a low-ohmic current path. As a result, the transistor is switched off.

The time $T_{CH}$ is adjustable and is initially set to a default value small enough to ensure that the gate voltage $V_G$ will not exceed the target value $V_{G0}$ even if the combination of the actual parameters $V_{BOOT}$, $R_{EQ}$ and $C_{EQ}$ (cf. FIG. 2), which may vary due to tolerances, represent a worst case (bootstrap voltage at the higher end and the time constant $R_{EQ}C_{EQ}$ at the lower end). At the end of the charging time $T_{CH}$ the actual voltage level at the gate electrode is sampled, e.g., using a sample and hold circuit. The sampling time instant is determined by the rising edge of the signal SMP, which may immediately follow after the falling edge of the signal IN' (see fourth (bottom) diagram of FIG. 4). The time $T_{CH}$ can then be adjusted based on the sampled gate voltage level. If the sampled value is lower than the target value $V_{G0}$ (or $V_G-\Delta V$), then the time $T_{CH}$ is increased by a specific amount so that, in the next switching cycle, the gate is charged to a somewhat higher level as in the preceding cycle. Conversely, if the sampled value is higher than the target value $V_{G0}$ (or $V_G+\Delta V$), then the time $T_{CH}$ is decreased. If the sampled value equals the target level $V_{G0}$ (or is within a specific interval $V_{G0}\pm\Delta V$), then the time $T_{CH}$ may remain unchanged.

Figure 5:
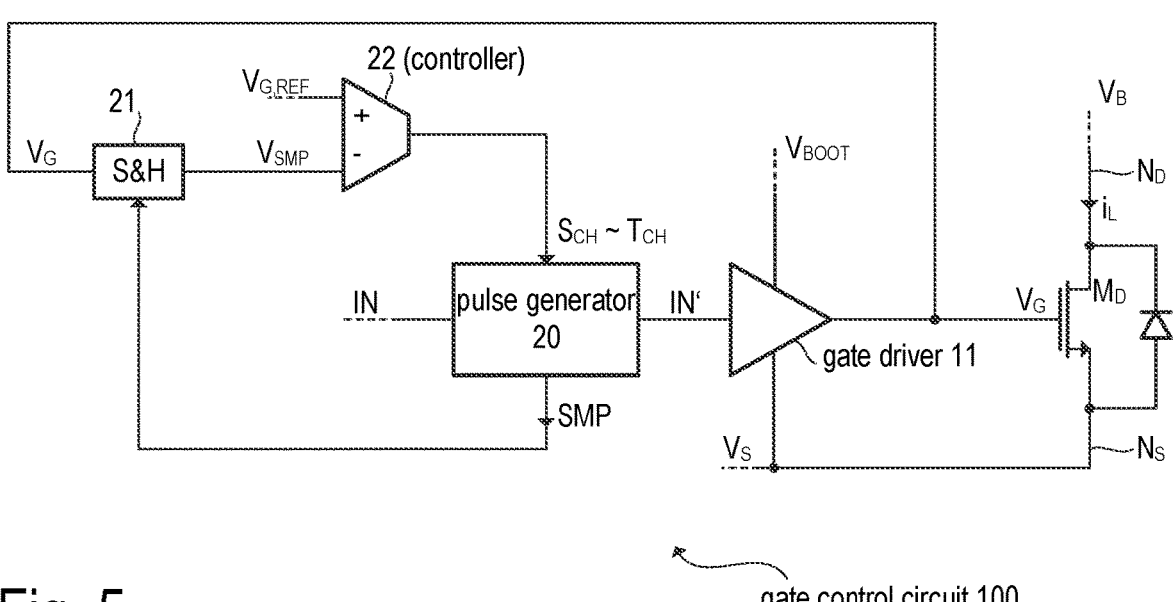
FIG. 5 illustrates one example implementation of a gate driver circuit in accordance with one embodiment.

One exemplary implementation of the concept explained above is illustrated in FIG. 5 (gate control circuit 100). FIG. 5 shows the power MOS transistor $M_D$ whose drain-source current path is coupled between the circuit nodes $N_D$ (connected to drain) and $N_S$ (connected to source). The supply voltage $V_B$ is applied to the node $N_D$. An impedance (load, not shown) may be connected between node $N_S$ and a reference voltage (e.g. ground). Similar to FIG. 1, the gate driver 11 is supplied by the bootstrap voltage $V_{BOOT}$, wherein the floating potential at node $N_S$ is the reference voltage for the gate driver circuit 11. Different from the circuit of FIG. 1, the pulse signal IN' is supplied to the input of the gate driver 11, which produces a corresponding output signal. As shown in FIG. 4, the signal IN includes, in each switching cycle, a short pulse with an adjustable pulse length $T_{CH}$. According to the example of FIG. 5, the pulse generator 20 is configured to receive the input signal IN (cf. FIG. 4) and to generate the pulse signal IN' in response to a rising edge if the input signal IN, wherein the pulse length $T_{CH}$ depends on a level of a pulse control signal $S_{CH}$. It is noted that, in the present example, the rising edge of the input signal IN serves as a switch-on command, which initiates the process of switching-on the transistor $M_D$. Other types of switch-on commands (e.g. a falling edge, a specific digital word received via a serial communication link, etc.) may be used dependent on the actual application.

The example of FIG. 5 further includes a sampling circuit 21 that is configured to sample the gate voltage $V_G$ generated by the gate driver 11 subsequent to the pulse (i.e. after the time interval $T_{CH}$, see FIG. 4) and to store a respective sampled value $V_{SMP}$. A controller 22 is configured to receive the sampled value $V_{SMP}$ and a reference voltage $V_{G,REF}$ (that represents the desired target level $V_{G0}$ of the gate voltage in the present example) and to update the level of the pulse control signal $S_{CH}$ based on the sampled value $V_{SMP}$ and the reference voltage $V_{G,REF}$. In the depicted embodiment, the controller 22 is basically a difference amplifier which amplifies the difference $V_{G,REF}-V_{SMP}$. This means basically a P-controller. However, other types of controllers may be used in other embodiments. If, in one switching cycle, the gate voltage $V_G$—and thus the sampled value $V_{SMP}$—is lower than the reference value $V_{G,REF}$, then the pulse control signal $S_{CH}$ will be adjusted to increase the time $T_{CH}$ in the next switching cycle, which will result in a higher gate voltage $V_G$. Similarly, if the gate voltage $V_G$—and thus the sampled value $V_{SMP}$—is higher than the reference value $V_{G,REF}$, then the pulse control signal $S_{CH}$ will be adjusted to decrease the time $T_{CH}$ in the next switching cycle, which will result in a lower gate voltage $V_G$. In steady state with continuously repeating switching cycles, the gate voltage $V_G$ will approximately be equal to the reference voltage value $V_{G,REF}$.

Before being updated for the first time, the level of the pulse control signal $S_{CH}$ is at a predetermined initial level. The initial level may be used to generate the first pulse in response to the first switch-on command after a startup (power-on) of the circuit.

Figure 6:
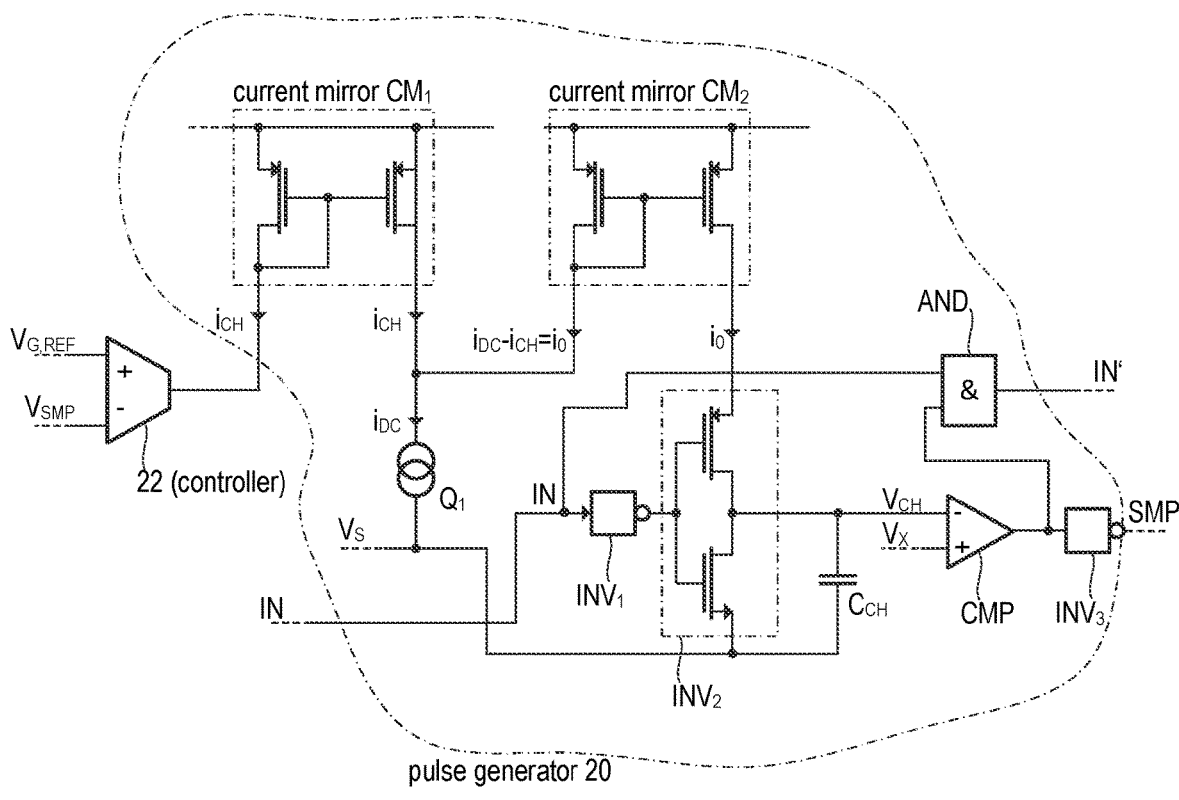
FIG. 6 illustrates one exemplary implementation of the pulse generator used in the example of FIG. 5 in more detail.

FIG. 6 illustrates one example implementation of the pulse generator circuit 20 in more detail. In the depicted example, it is assumed that the controller 22 has a current output like, for example, a transconductance amplifier. The controller 22 sinks a current $i_{CH}$ at its output, wherein the current $i_{CH}$ depends on the difference $V_{G,REF}-V_{SMP}$. The higher the difference $V_{G,REF}-V_{SMP}$, the higher the current $i_{CH}$ at the output of controller 22. The current $i_{CH}$ is "mirrored" to another current path by a first current mirror $CM_1$. That is the current $i_{CH}$ passes though the input path of current mirror $CM_1$ that is coupled to the output of the controller 22, wherein the output current path of current mirror $CM_1$ provides the mirrored current, which may be equal to the current in the input path. A current sink $Q_1$ is connected to the output of the current mirror $CM_1$ and configured to sink a constant DC current $i_{DC}$. Further, the input path of a second current mirror $CM_2$ is connected to the output of the first current mirror $CM_1$. Following Kirchhoff's current law, the current $i_o$ passing through the input path of the second current mirror $CM_2$ must equal $i_{DC}$ minus $i_{CH}$ ($i_o=i_{DC}-i_{CH}$). The input current $i_o$ of current mirror $CM_2$ is mirrored to the output of the current mirror $CM_2$.

An inverter $INV_2$ is supplied by the output current $i_o$ of the second current mirror $CM_2$ and accordingly, the current $i_o=i_{DC}-i_{CH}$ is the maximum output current of the inverter $INV_2$ when the inverter output is at a high level. Another inverter $INV_1$ is connected ahead of the inverter $INV_2$. Accordingly, the inverter chain $INV_1$ and $INV_2$ does not change the logic state of the input signal IN supplied to the inverter $INV_1$ in a steady state, but the output current of the inverter chain is limited to the current level $i_o$. A capacitor $C_{CH}$ is coupled to the output of inverter $INV_2$. Accordingly, upon with a rising edge in input signal IN the capacitor $C_{CH}$ is charged with the current $i_o$. The resulting capacitor voltage $V_{CH}$ will ramp up until it reaches approximately the supply voltage of the inverter $INV_2$ (approximately $V_{BOOT}$ minus the voltage drop in current mirror $CM_2$).

The capacitor voltage $V_{CH}$ (voltage ramp) is compared with a reference voltage $V_X$ by comparator CMP, which is configured to signal (e.g. by a low level at its output) that the capacitor voltage $V_{CH}$ has exceeded the reference voltage $V_X$. The comparator output voltage is used to blank the input voltage IN using an AND gate which receives, as input signals, the input signal IN and the comparator output signal. The output signal of the AND gate is denoted as IN' (see also FIG. 4). The signal IN' follows the input signal IN before it is blanked by the comparator output signal a time $T_{CH}$ following the rising edge of the input signal. The time $T_{CH}$ depends on the current $i_o$ and the capacitance $C_{CH}$, wherein the current $i_o$ depends on the controller output current $i_{CH}$. If the controller output current $i_{CH}$ increases, the current $i_o$ will decrease and, consequently, the capacitor $C_{CH}$ is charged more slowly and the time $T_{CH}$ increases. The time $T_{CH}$ is the pulse length of the pulse in signal IN' triggered, e.g., by a rising edge in input signal IN (see FIG. 4). The inverted comparator output signal (inverter $INV_3$) may be provided as output signal SMP that triggers the sampling circuit 21 as explained above. Accordingly, the pulse length $T_{CH}$ is determined by the controller output current $i_{CH}$ and thus by the sampled voltage value $V_{SMP}$, wherein at the end of the pulse a new value is sampled.

It is noted that FIGS. 5 and 6 illustrate a concept for charging the gate capacitance in order to switch the power transistor $M_D$ on. The circuitry for discharging the gate capacitance in order to switch the power transistor $M_D$ off is not shown in order to keep the drawings simple. However, known concepts may be used to switch off the power transistor $M_D$ such as, for example, an electronic switch (e.g. another transistor) configured to electrically connect gate and source electrode of the power transistor $M_D$ in response to a falling edge of the input signal IN. Of course gate and source electrode of power transistor $M_D$ need to be disconnected at or before the next rising edge of the input signal IN in order to allow another switch-on. Alternatively, a concept similar to the concept used for switching the power transistor $M_D$ on may also be used to switch the power transistor $M_D$ off.

Figure 7:
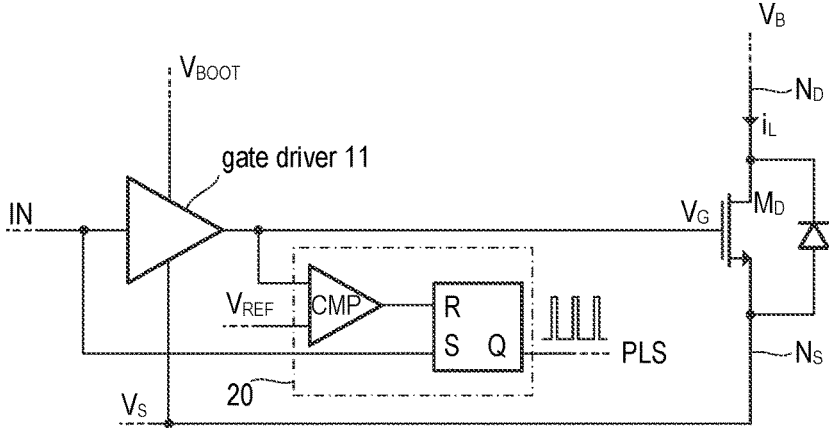
FIG. 7 illustrates an exemplary alternative to the circuit of FIG. 5 which is suitable for applications with lower switching speed requirements.

FIG. 7 illustrates a conventional gate driver 11 which may be used in applications with lower switching speed requirements. In this example, the voltage $V_{BOOT}$ is basically equal to the target value $V_{G0}$ of the gate voltage. As discussed above with reference to FIG. 2, diagram (b), it may take a time of $4\tau$ to $5\tau$ to charge the gate capacitance $C_{EQ}$ to the level $V_{G0}$, which is needed to drive the power transistor $M_D$ into its low-ohmic state. In such applications, the switching time may be measured by using a pulse generator 20 that is configured to generate a pulse that represents the switching time (rise time and/or fall time). In the present example, the comparator CMP compares the actual gate voltage $V_G$ with the reference voltage $V_{G,REF}$, which may be, for example, 90 percent of the target level $V_{G0}$. An RS flip-flip (SR latch) is set in response to a high level of the gate driver's input signal IN, and reset to a low level in response to the comparator CMP detecting that the gate voltage $V_G$ has reached the reference voltage $V_{G,REF}$. The output Q of the RS flip-flip is a pulse triggered by a rising edge of the input signal IN, wherein the pulse length $T_{CH}$ represents the rise time of the gate voltage (similar to signal IN' in FIG. 4).

Figure 8:
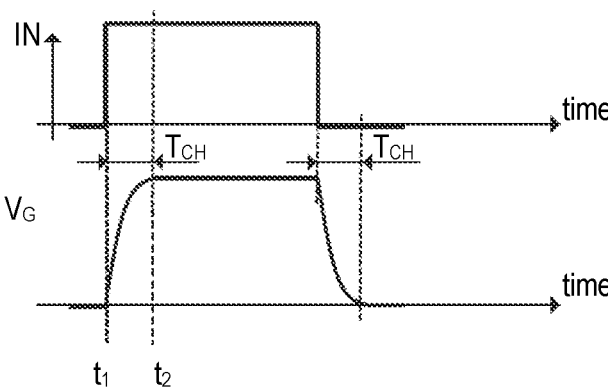
FIG. 8 illustrates timing diagrams illustrating, by way of example, the operation principle of the circuit of FIG. 7.

Exemplary waveforms of the signals IN and $V_G$ are illustrated in FIG. 8. Time $t_1$ denotes the time of the rising edge in the input signal IN, which causes the gate driver 11 of FIG. 7 to charge the gate of the power transistor $M_D$. At time $t_2$ the gate voltage $V_G$ reaches the reference voltage $V_{G,REF}$ (which is, in the present example, a specific fraction of the target value $V_{G0}$, e.g. 90, 95 or 99 percent). The time interval $t_2-t_1$ is the pulse length TCH of the pulse generated by the RS flip-flop of FIG. 7. The time for discharging the gate may be determined in a similar way (not illustrated in FIG. 7).

The embodiments described in the following use the pulse signal IN' and evaluate the pulse length to detect a degradation of the power circuit including the MOS transistor $M_D$ and the respective gate driver 11. Before discussion the embodiments in more detail, the basic concept is discussed with reference to the timing diagrams of FIG. 9.

Figure 9:
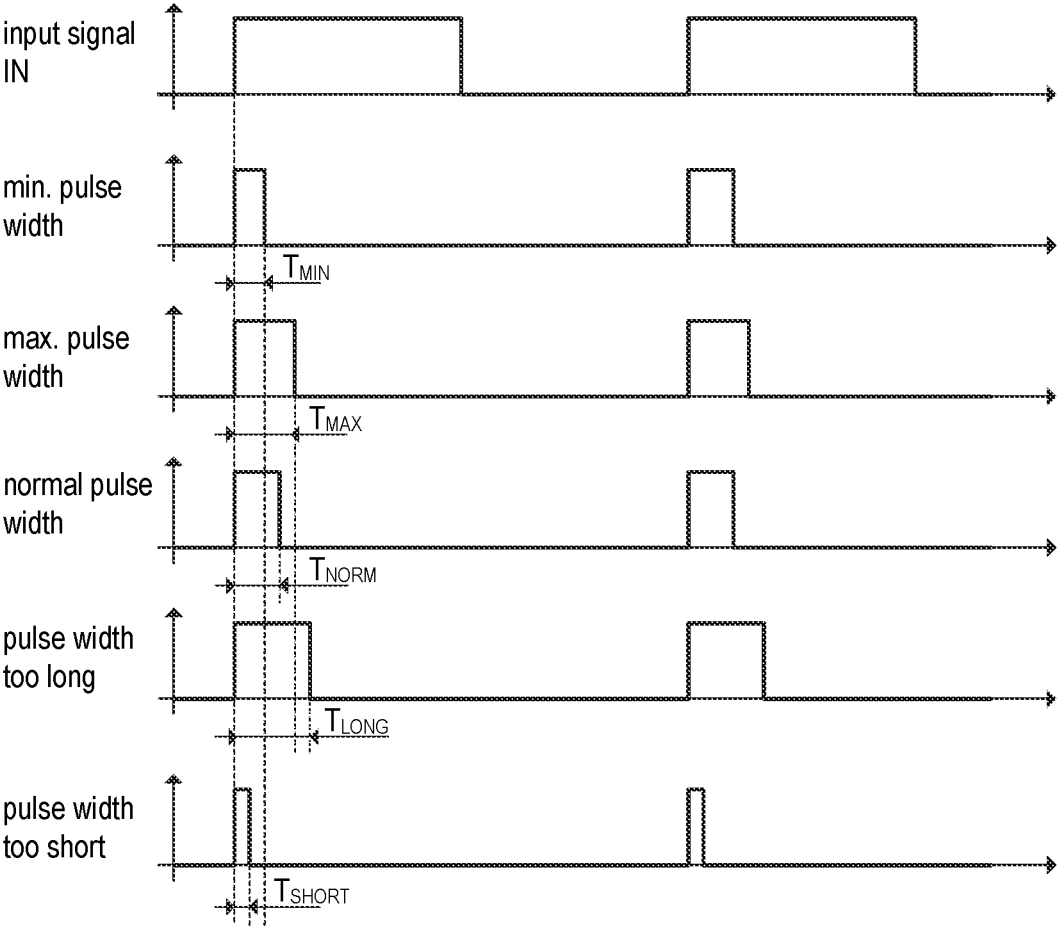
FIG. 9 illustrates timing diagrams illustrating the degradation detection concept implemented by the embodiments described herein.

The first (from the top) diagram of FIG. 9 illustrates the input signal IN. The signal IN is a modulated signal with repetitive on-times (high levels), which are typical for pulse-width modulation (PWM), pulse frequency modulation (PFM) or the like. The other timing diagrams illustrate the pulses PLS (=IN') which may be generated, for example, by the pulse generators 20 described herein with reference to FIGS. 5 to 7. As discussed above, the pulse length $T_{CH}$ corresponds to the time that it takes until the gate voltage $V_G$ performs a specific level transition (e.g. from low to high) in response to a corresponding level transition (e.g. also from low to high) in the input signal IN.

The pulse length $T_{CH}$ may vary due to numerous factors such as temperature drift, aging effects, production tolerances, etc. Therefore, for a specific type of circuits the pulse length $T_{CH}$ will be, in general, between a minimum pulse length $T_{MIN}$ and a maximum pulse length $T_{MAX}$ if the circuits are flawless. A pulse signal with the minimum pulse length $T_{CH}=T_{MIN}$ is illustrated in the second timing diagram of FIG. 9, and a pulse signal with the maximum pulse length $T_{CH}=T_{MAX}$ is illustrated in the third timing diagram of FIG. 9. As discussed above, a normal pulse length will be between $T_{MIN}$ and $T_{MAX}$, i.e. $T_{MIN}<T_{CH}<T_{MAX}$. This situation is shown in the fourth timing diagram of FIG. 9.

An overlong pulse length ($T_{CH}>T_{MAX}$) may indicate a degraded circuit. For example, an overlong pulse length may be an indicator for a faulty gate driver circuit and may occur, for example, when the output stage of the gate driver—for some reason—does not deliver sufficient current for charging the gate at the desired speed. This situation is illustrated in the fifth timing diagram of FIG. 9.

Similarly, a pulse that is too short ($T_{CH}<T_{MIN}$) may also indicate a degraded circuit. For example, a too short pulse length may be an indicator for a defective power transistor $M_D$ and may occur, for example, when—for some reason—something is wrong with the gate and the gate capacitance of the power transistor $M_D$ is significantly lower than normal. In particular, when some transistor cells of the power transistor are defective or not properly connected, this may affect the gate capacitance. This situation is illustrated in the sixth timing diagram of FIG. 9 (bottom diagram).

The embodiments described herein may include a comparator circuit that is configured to receive the pulse signal PLS (e.g. from the pulse generator 20 of FIGS. 5-7) and to detect whether the pulse length $T_{CH}$ is above a first threshold (e.g. max. pulse length $T_{MAX}$) or below a second threshold (e.g. min. pulse length $T_{MIN}$). An example is illustrated in FIG. 10.

Figure 10:
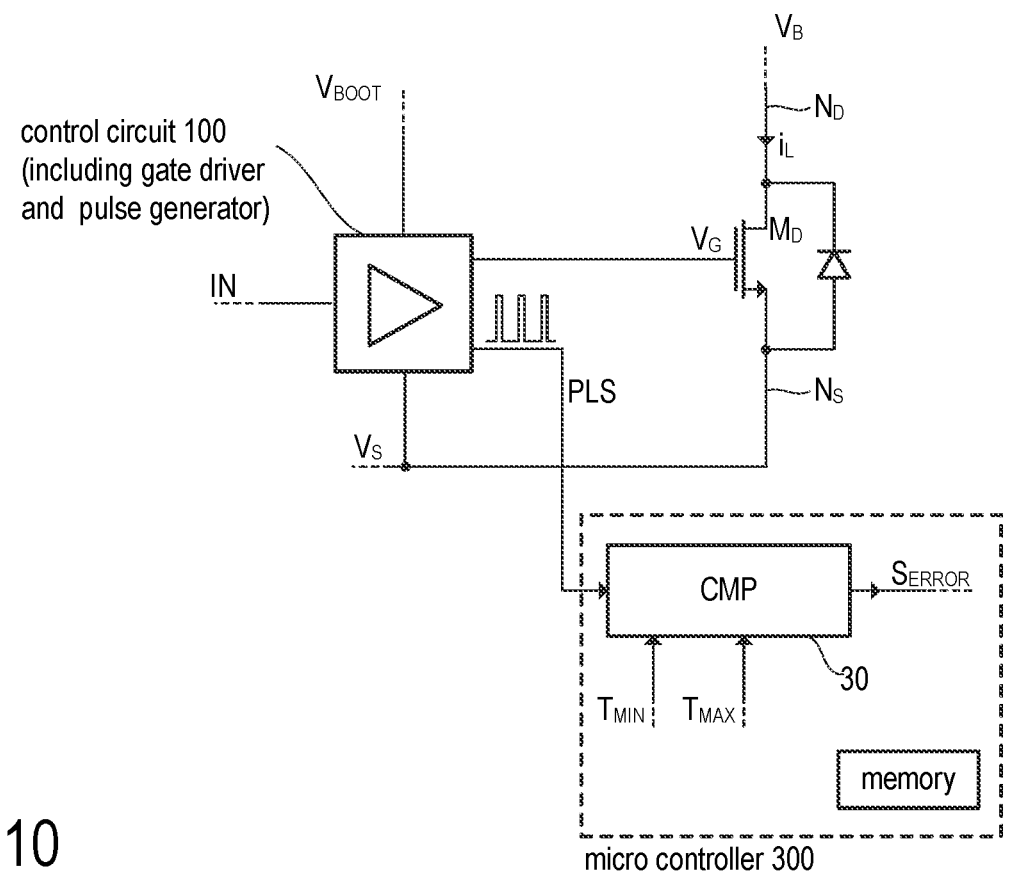
FIG. 10 illustrates one embodiment of a circuit arrangement that makes use of the concept illustrated in FIG. 9.

FIG. 10 shows a control circuit 100, which basically includes a gate driver circuit (cf. FIGS. 5 and 7, gate driver 11) and a pulse generator (cf. FIG. 5-7, pulse generator 20) and, as the case may be, further circuitry such as the sampling circuit 21 and the controller 22 of FIG. 5. The control circuit 100 is supplied by the supply voltage $V_{BOOT}$ that may be provided by a bootstrap circuit (cf. FIG. 1). Dependent on the application the supply voltage $V_{BOOT}$ may be, for example, 3V for lower requirements concerning the switching speed, wherein higher supply voltages (e.g. 8V) may be used for higher requirements concerning the switching speed (cf. FIGS. 3 and 5). FIG. 10 also shows the comparator circuit 30, which is configured to receive the pulse signal PLS from the control circuit 100 and to evaluate the pulse length in order to detect anomalies of the pulses.

The comparator circuit 30 may be implemented using a micro-controller (see FIG. 10, microcontroller 300) which includes a memory for storing data and software instructions and a processor for executing the instructions stored in the memory. The microcontroller 300 may further include peripheral circuitry (not explicitly shown in FIG. 10) such as a clock generator as well as analog and digital inputs and outputs. The pulse signal PLS may be, for example, monitored using a digital input of the microcontroller and the comparator circuit 30 may be implemented using—at least partly—software instructions executed by the processor of the micro-controller. It is, however, understood that the comparator circuit may also be implemented using hardwired or one-time programmable digital circuitry) which does not require software). In this case, the comparator circuit is a logic circuit composed of gates and other logic components. The times $T_{MIN}$ and $T_{MAX}$ are a-priori known system parameters (defined by the designer or user of the power circuit) that may be stored in the memory of the microcontroller 300.

In one embodiment, the pulse lengths are measured and stored in a memory (e.g. the memory of the microcontroller). This also allows the microcontroller (or any other entity, to which the microcontroller provides the necessary data) to analyze the change of the pulse length over time. As mentioned, the comparator circuit may be configured to detect whether the pulse length $T_{CH}$ is above a first threshold or below a second threshold. These thresholds may depend on the initial pulse length so that an error is signaled when the pulse length has changed by a specific time. Furthermore, the microcontroller may also signal an error when the pulse length exhibits a sudden change within a defined (relatively short) time. In one example, an error is signaled when the pulse length is outside a specific range (e.g. from $T_{MIN}$ to $T_{MAX}$) that depends on the measured pulse lengths stored in the memory. Finally, the microcontroller may communicate the history of the stored pulse length data to another entity, e.g. to a superordinate controller, an ECU or the like.

The comparator 30 may be configured to generate at least one error signal $S_{ERROR}$ in response to detecting that the current pulse does not satisfy the condition $T_{MIN}<T_{CH}<T_{MAX}$. In some embodiments, different error signals may be generated to distinguish between different types of errors, e.g. $T_{CH}\leq T_{MIN}$ and $T_{CH}\geq T_{MAX}$. The error signal(s) may be communicated to another device, e.g. to a superordinate controller, an electronic control unit (ECU), or the like, which may take appropriate action in response to a detected error. For this purpose the micro-controller may include a communication interface (e.g. a Serial Peripheral Interface, SPI, or the like) which allows communication with other devices.

Figure 11:
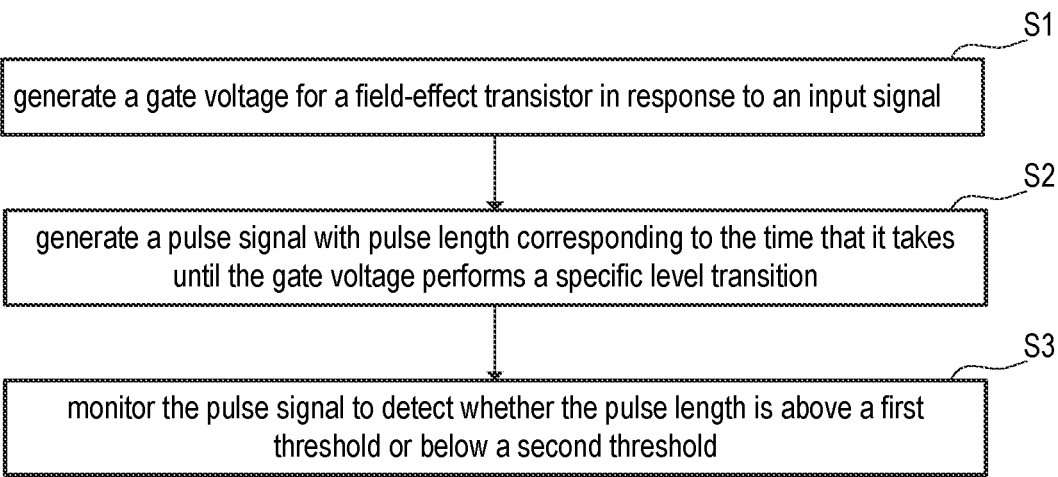
FIG. 11 is a flow chart illustrating a method that allows for detecting a degradation of a power circuit including a gate driver and a respective field-effect transistor.

The concept described herein is further described with reference to the flow chart of FIG. 11, which illustrates a method that may be used to detect a degradation of a power circuit including at least a gate driver and a respective power field-effect transistor. In the depicted example, the method includes generating a gate voltage $V_G$ for a field-effect transistor in response to an input signal (see FIG. 11, box S1), for example in response to a switch-on command represented by the input signal or a level transition in the input signal (see also FIGS. 4 and 10). The method further includes generating a pulse signal with a pulse length $T_{CH}$ that corresponds to the time that it takes until the gate voltage $V_G$ performs a specific level transition in response to a corresponding level transition in the input signal (see FIG. 11, box S2). Furthermore, the method includes monitoring the pulse signal to detect whether the pulse length $T_{CH}$ is above a first threshold (e.g. $T_{MAX}$) or below a second threshold (e.g. $T_{MIN}$). See FIG. 11, box S3. This method may be implemented by the circuit of FIG. 10, wherein the pulse signal is generated by the control circuit 100 and the monitoring is performed by the comparator circuit 30 of the microcontroller.

An error may be signaled (e.g. to a superordinate controller, an ECU, or the like) when the pulse length $T_{CH}$ is above the first threshold ($T_{CH} > T_{MAX}$) or below the second threshold ($T_{CH} < T_{MIN}$). In one embodiment, the generation of the pulse signal includes the detection of the time—from the level transition in the input signal—that it takes until the gate voltage $V_G$ reaches a predefined reference voltage $V_{G,REF} = V_{G0}$ (see, e.g. FIG. 3). The reference voltage $V_{G,REF}$ is either equal to the target level $V_{G0}$ of the gate voltage (in the example of FIG. 3) or a predefined fraction (e.g. 95 percent) of the gate voltage (in the example of FIG. 8). The first and the second thresholds are system parameters that may be stored (e.g. by a user of the circuit) in a memory of a microcontroller, which may be used to monitor the pulse signal in some embodiments.

Although the invention has been illustrated and described with respect to one or more implementations, alterations and/or modifications may be made to the illustrated examples without departing from the spirit and scope of the appended claims. For example, inverted logic levels can be used, and logic operations such as AND, NAND, OR, etc. can generally be replaced by different logic operations using commonly known concepts. In particular regard to the various functions performed by the above described components or structures (units, assemblies, devices, circuits, systems, etc.), the terms (including a reference to a "means") used to describe such components are intended to correspond—unless otherwise indicated—to any component or structure, which performs the specified function of the described component (e.g., that is functionally equivalent), even though not structurally equivalent to the disclosed structure, which performs the function in the herein illustrated exemplary implementations of the invention.

The invention claimed is:

1. A circuit comprising:
   a control circuit configured to generate a gate voltage for a field-effect transistor in response to an input signal;
   a pulse generator configured to generate a pulse signal, wherein the pulse signal has a pulse length that corresponds to a length of time from a level transition of the input signal to a specific level transition of the gate voltage in response to the level transition of the input signal; and a monitoring circuit configured to receive the pulse signal and to detect whether the pulse length is outside a specific range.

2. The circuit of claim 1, wherein the monitoring circuit is configured to detect whether the pulse length is above a first threshold or below a second threshold.

3. The circuit of claim 2, wherein the monitoring circuit is configured to signal an error when the pulse length is above the first threshold or below the second threshold.

4. The circuit of claim 2, wherein:
   the control circuit comprises a gate driver and the pulse generator; or
   the first threshold and the second threshold are parameters stored in a memory.

5. The circuit of claim 1, wherein the pulse length represents the time that it takes until the gate voltage reaches a predefined reference voltage subsequent to the level transition in the input signal.

6. The circuit of claim 5, wherein the predefined reference voltage is either equal to a target level of the gate voltage or a predefined fraction of the gate voltage.

7. The circuit of claim 1, wherein the monitoring circuit is further configured to measure the pulse length, store the measured pulse length in a memory, and signal an error when a currently measured pulse length is outside the specific range.

8. The circuit of claim 7, wherein the specific range depends on the measured pulse lengths stored in the memory.

9. The circuit of claim 1, further comprising the field-effect transistor.

10. A method comprising:
   generating a gate voltage for a field-effect transistor in response to an input signal;
   generating a pulse signal with a pulse length that corresponds to a length of time from a level transition of the input signal to a specific level transition of the gate voltage in response to the level transition of the input signal; and
   monitoring the pulse signal to detect whether the pulse length is outside a specific range.

11. The method of claim 10, wherein the specific range is between a second threshold and a first threshold.

12. The method of claim 11, further comprising signaling an error when the pulse length is above the first threshold or below the second threshold.

13. The method of claim 11, wherein:
   the first threshold and the second threshold are parameters stored in a memory of a microcontroller; or
   the monitoring of the pulse signal is performed by the microcontroller.

14. The method of claim 10, wherein generating the pulse signal comprises detecting a time, from the level transition in the input signal, that it takes until the gate voltage reaches a predefined reference voltage.

15. The method of claim 14, wherein the reference voltage is either equal to a target level of the gate voltage or a predefined fraction of the gate voltage.

16. The method of claim 10, further comprising:
   measuring the pulse length;
   storing the measured pulse length in a memory; and
   signaling an error when a currently measured pulse length is outside the specific range.

17. The method of claim 16, wherein the specific range depends on the measured pulse lengths stored in the memory.

18. A circuit comprising:

a pulse generator comprising a trigger input node and a pulse signal output node;

a gate driver circuit having an input coupled to the pulse signal output node of the pulse generator and an output configured to be coupled to a control node of a switching transistor;

a feedback circuit coupled between the output of the gate driver circuit and a pulse width adjustment input of the pulse generator, wherein the feedback circuit is configured to cause the pulse generator to generate a signal at the pulse signal output node having a pulse width corresponding to a length of time from a level transition of an input signal at the trigger input node to a specific level transition of a gate voltage at the output of the gate driver circuit in response to the level transition of the input signal; and a pulse width comparator having an input node coupled to the pulse signal output node of the pulse generator, and an output configured to indicate that the pulse width of the signal at the pulse signal output node of the pulse generator is outside of a first range of values.

19. The circuit of claim 18, wherein the pulse width comparator comprises:

a processor;

a memory coupled to the processor with instructions stored thereon, wherein the instructions, when executed by the processor enable the processor to:

measure the pulse width of the signal at the pulse signal output node of the pulse generator;

compare the measured pulse width to a first threshold and a second threshold stored in the memory; and assert an error signal in response to the measured pulse width being less than the first threshold or greater than the second threshold.

20. The circuit of claim 18, wherein the feedback circuit comprises:

a sample and hold circuit having an input coupled to the output of the gate driver circuit; and an amplifier having a first input coupled to an output of the sample and hold circuit, a second input coupled to a node configured to provide a signal representative of a gate driver output target voltage, and an output coupled to the pulse width adjustment input of the pulse generator.

* * * * *